(12) United States Patent
Chien et al.

(10) Patent No.: US 10,141,479 B1
(45) Date of Patent: Nov. 27, 2018

(54) LIGHT-EMITTING PACKAGE STRUCTURE PROVIDED WITH PREDETERMINED VIEW ANGLE

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: I-Chen Chien, Keelung (TW); Shih-Chang Hsu, Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/127,319

(22) Filed: Sep. 11, 2018

Related U.S. Application Data

(63) Continuation of application No. 15/713,865, filed on Sep. 25, 2017, now Pat. No. 10,103,291.

(30) Foreign Application Priority Data

Jan. 20, 2017 (CN) .......................... 2017 1 0048340

(51) Int. Cl.
| | |
|---|---|
| *H01L 33/54* | (2010.01) |
| *H01L 33/62* | (2010.01) |
| *H01L 33/38* | (2010.01) |
| *H01L 33/48* | (2010.01) |
| *H01L 23/00* | (2006.01) |

(Continued)

(52) U.S. Cl.
CPC .............. *H01L 33/38* (2013.01); *H01L 24/95* (2013.01); *H01L 33/483* (2013.01); *H01L 33/50* (2013.01); *H01L 33/54* (2013.01); *H01L 33/60* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 2007/0008734 A1* | 1/2007 | Bogner | .................... B60Q 1/04 362/509 |
| 2011/0140128 A1* | 6/2011 | Leatherdale | ............ H01L 33/20 257/78 |

(Continued)

*Primary Examiner* — Alexander Ghyka
(74) *Attorney, Agent, or Firm* — Li & Cai Intellectual Property (USA) Office (57) ABSTRACT

A method for forming a light-emitting package structure provided with a predetermined view angle is provided. The method includes the steps of: disposing a flip chip on a carrier substrate; filling an underfill material between at least two electrodes of the flip chip for supporting the flip-chip; laser lifting-off a growing substrate from the flip chip for forming a thin film chip and exposing an epitaxial structure from the thin film chip; roughening the epitaxial structure exposed from the thin film chip; providing a view angle adjusting structure including a wavelength converting layer on the thin film chip, and selecting a predetermined view angle and achieving the predetermined view angle by adjusting the view angle adjusting structure according to a linear regression formula.

19 Claims, 10 Drawing Sheets

(51) Int. Cl.
*H01L 33/60* (2010.01)
*H01L 33/50* (2010.01)

(56) References Cited

U.S. PATENT DOCUMENTS

| 2011/0204325 A1* | 8/2011 | Kim ..................... H01L 33/382 |
| | | 257/13 |
| 2014/0048827 A1* | 2/2014 | Inoue ..................... H01L 33/08 |
| | | 257/88 |
| 2014/0353677 A1* | 12/2014 | Tak ..................... H01L 21/0254 |
| | | 257/76 |
| 2016/0155901 A1* | 6/2016 | Lopez ..................... H01L 33/06 |
| | | 257/13 |
| 2016/0260872 A1* | 9/2016 | Butterworth ............ H01L 33/54 |

* cited by examiner

LIGHT-EMITTING PACKAGE STRUCTURE PROVIDED WITH PREDETERMINED VIEW ANGLE

CROSS REFERENCE TO RELATED APPLICATIONS

This application is a continuation application of prior application Serial No. U.S. Ser. No. 15/713,865 filed on Sep. 25, 2017, now pending, the entire contents of which are incorporated herein by reference. The application Serial No. U.S. Ser. No. 15/713,865 claimed the benefit of priority to China Patent Application No. 201710048340.5, filed on Jan. 20, 2017.

BACKGROUND OF THE INVENTION

1. Technical Field

The instant disclosure relates to a light-emitting package structure provided with predetermined view angle, a light-emitting package module including the same and a method for forming the same, and in particular, to a light-emitting package structure having a view angle adjusting structure for being adjusted according to a linear regression formula so as to achieve a predetermined view angle.

2. Description of Related Art

Generally, in order to achieve desired light patterns and optimum light efficiency, the application of light-emitting diodes (LED) in automotive and flash lights require a smaller view angle with secondary optical lenses. The view angle of an LED is generally adjusted by the optical design of the lenses. Since relevant products are nowadays required to be thin and, Fresnel lenses having relatively low thickness are generally used for the flash light of mobile phones. In addition, in order to fulfill different needs, specific view angles are selected to be used in combination with secondary optical lenses with specific design. However, the design and manufacture of the secondary optical lens increase manufacturing costs of the products.

Plastic Leaded Chip Carrier (PLCC) LEDs or lamp-type LEDs employ a bowl-type structure as a package structure to control the view angle thereof. Therefore, additional mold developments are necessary for achieving different view angles and hence, the time and costs of the manufacturing process are increased.

Molding-type LEDs have adjustable view angles based on different lens designs or shapes of the LEDs. Generally, in order to reduce the view angle, a reflecting wall is designed to surround the LED. However, the reflecting wall may absorb lateral light emitted by the chips, thus reducing the light intensity and brightness.

SUMMARY

The object of the instant disclosure is to provide a light-emitting package structure provided with a predetermined view angle and a method for forming the same. By adjusting the thickness of a wavelength converting layer as a view angle adjusting structure, the relative height of a top surface of a reflecting wall and a top surface of the wavelength converting layer, and the reflectivity of the reflecting wall, the predetermined view angle can be achieved. Therefore, the optical design of the light-emitting package structure becomes more flexible.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Reference will now be made in detail to the exemplary embodiments of the instant disclosure, examples of which are illustrated in the accompanying drawings. Wherever possible, the same reference numbers are used in the drawings and the description to refer to the same or like parts.

Figure 1:
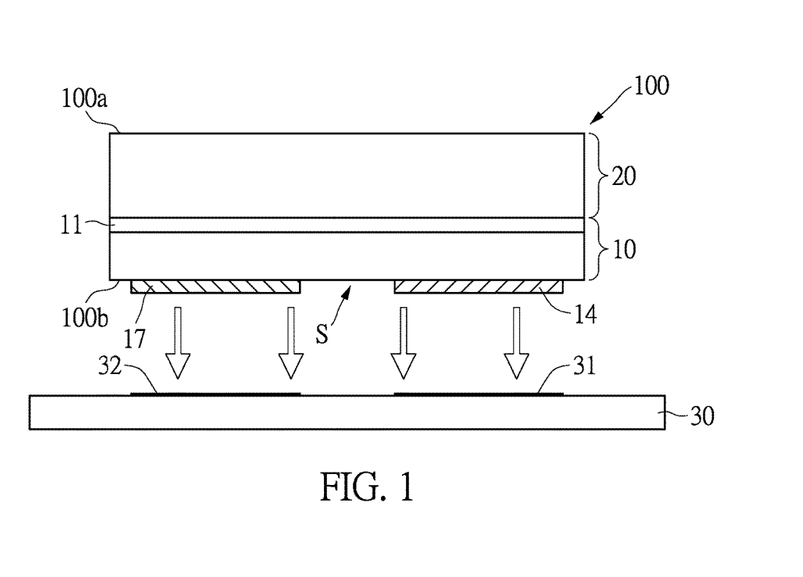
FIG. 1 is a schematic view showing a die-bonding process of a light-emitting diode structure of the instant disclosure.

Referring to FIG. 1, the instant disclosure provides a method for forming a light-emitting diode structure. A first step of the method includes providing a flip chip 100. The flip chip 100 has a growth substrate 20, an epitaxial structure 10 formed on the growth substrate 20 and at least a pair of metal pads 14, 17 formed on the epitaxial structure 10. A gap S is located between the metal pad 14 and the metal pad 17.

The growth substrate 20 of the present embodiment can be a sapphire substrate. The flip chip 100 has a first surface 100a (such as the upper surface shown in FIG. 1) and a second surface 100b (such as the lower surface shown in FIG. 1) opposite to the first surface 100a. The growth substrate 20 is located at the side of the first surface 100a, and at least one P-contact pad 17 and at least one N-contact pad 14 are formed on the side of the second surface 100b as the electrodes.

Figure 1A:
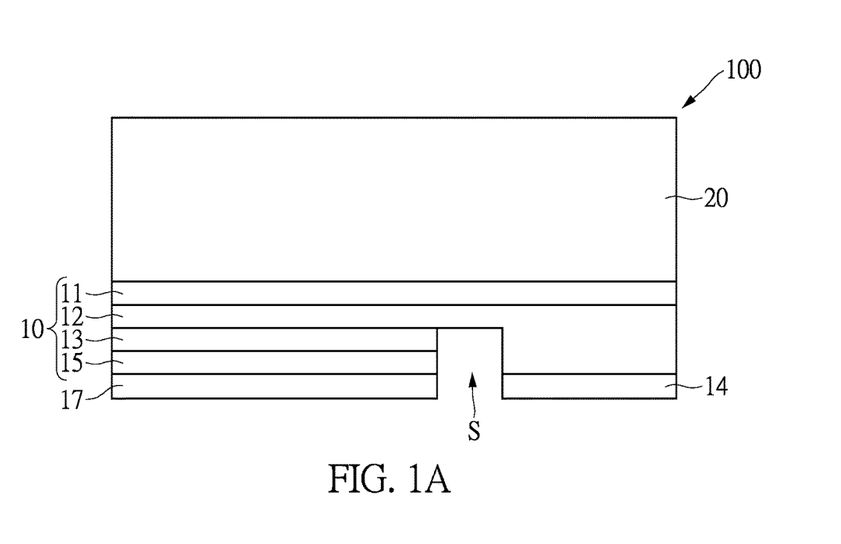
FIG. 1A is a schematic view of a structural example of a type of flip-chip structure employed by a flip chip of the instant disclosure.

Referring to FIG. 1A, the epitaxial structure 10 of each of the flip chips 100 is formed on the upper surface of the growth substrate 20 and each includes a buffering layer 11, a N-type semiconductor layer 12, a light-emitting layer 13 and a P-type semiconductor layer 15. The buffering layer 11 can be made of undoped-gallium nitride (GaN). The N-type semiconductor layer 12 can be made of N-type gallium nitride. The light-emitting layer 13 can be a semiconductor structure of a multiple quantum well (MQW). The P-type semiconductor layer 15 can be made of P-type gallium nitride. The N-contact pad 14 is connected to the N-type semiconductor layer 12. The P-contact pad 17 is connected to the P-type semiconductor layer 15. The gap S extends to a location between the P-type semiconductor layer 15 and the N-type semiconductor layer 12.

The structure of the epitaxial structure 10 mentioned above (a layered structure) is only an example, and the instant disclosure is not limited thereto. For example, in other embodiments, the buffering layer 11 can be omitted and the N-type semiconductor layer 12 can be directly formed on the growth substrate 20. In addition, the P-type semiconductor layer 15 can further have a metal layer or a transparent electrode layer thereon, and the P-type contact pad 17 is formed afterward.

Further referring to FIG. 1, the flip chip 100 is bonded to a carrier substrate 30. The carrier substrate 30 includes the circuit structures 31, 32 which are respectively in contact with the N-contact pad 14 and the P-contact pad (which act as the electrode) respectively. An underfill material is filled in the gap S between the N-type contact pad 14 and the P-type contact pad 17. The circuit structures 31, 32 can extend to the lower surface of the carrier substrate 30 or other positions based on design needs.

Figure 2:
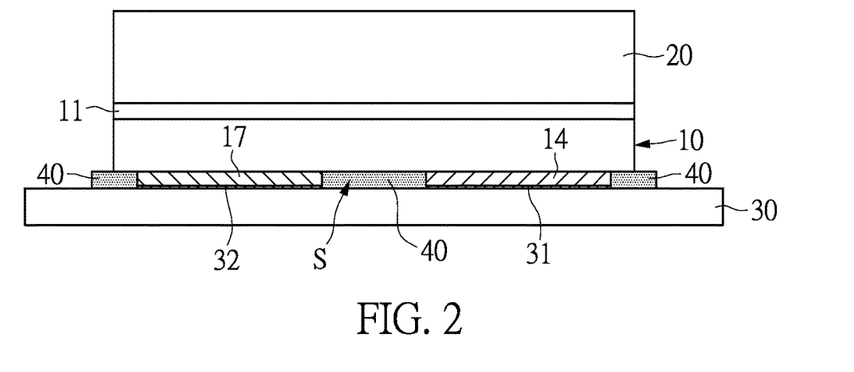
FIG. 2 is a schematic view of the flip chip of the instant disclosure adhering to a carrier substrate.

Referring to FIG. 2, the underfill material is filled in the gap S between the flip chip 100 and the carrier substrate 30, thereby forming a filling layer 40.

It should be noted that in addition to the gap S between the N-type contact pad 14 and the P-type contact pad 17, the underfill material is preferably filled into the entire space between the second surface 100b of the flip chip 100 and the carrier substrate 30 for enabling the flip chip 100 to be fully supported by the carrier substrate 30 through the filling layer 40. In other words, the filling layer 40 needs to contact the second surface 100b of the flip chip 100 and the upper surface of the carrier substrate 30 and surround the N-type contact pad 14, the P-type contact pad 17, and the circuit structures 31, 32. In addition, the filling layer 40 can further extend to a location in the epitaxial structure 10.

Figure 3:
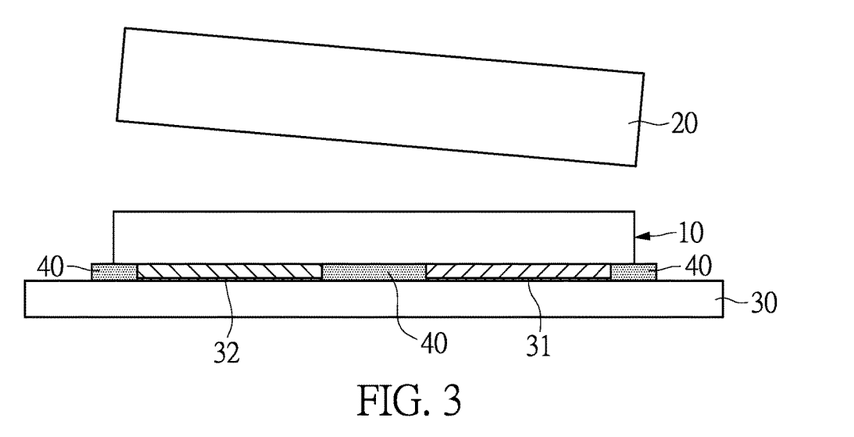
FIG. 3 is a flow chart of a lifting process of the flip chip of the instant disclosure.

Referring to FIG. 3, the second step of the method is laser lifting-off (LLO) the growth substrate 20 of the flip chip 100. A thin film chip (also referred to as a thin film flip chip) without the growth substrate 20 is formed. Preferably, the laser lift-off process is performed under a chip level process for avoiding stress generated during wafer level laser lift-off which may induce die warping. For example, in the present embodiment, a ultra-violet laser such as a KrF excimer laser having a wavelength of 248 nm can be employed. Since gallium nitride (GaN) has a relatively large absorption coefficient towards the 248 nm KrF excimer laser, the laser energy is almost completely absorbed at the interface. In comparison thereto, the absorption coefficient of gallium nitride towards 355 nm Nd:YAG laser is relatively small, while the laser penetration depth in the gallium nitride is larger and defects are formed inside of the material.

An example of the laser lifting-off process is described herein. When the growth substrate 20 is a sapphire substrate, the laser is focused at the buffering layer 11 (for example a gallium nitride layer) for laser lifting-off the sapphire substrate with a suitable energy, for example, in the range of 750 to 1100 mJ. Taking a 45 Mil flip chip as an example, 950 mJ of energy is sufficient to completely lift-off the substrate. Insufficient energy may lead to incomplete lifting-off of the sapphire substrate and damage the light-emitting layer. In addition, the size of the irradiation area generated by the laser beam must be slightly larger than the size of the flip chip intended to be lifted-off. Preferably, the length of the irradiation area is larger than the length of the flip chip by more than 40 micrometers (μm). Taking a 45 Mil flip chip as an example, since a length thereof is 1143 μm, a distance of about 60 μm is reserved for each edge, and the length of the irradiation area can be about 1260 μm. Therefore, the sample can be completely irradiated by the laser. It should be noted that since the laser energy is in Gaussian distribution, the uneven energy distribution may damage the chip, and hence, the position of the laser source can be adjusted during the process according to practical requirements.

Figure 4:
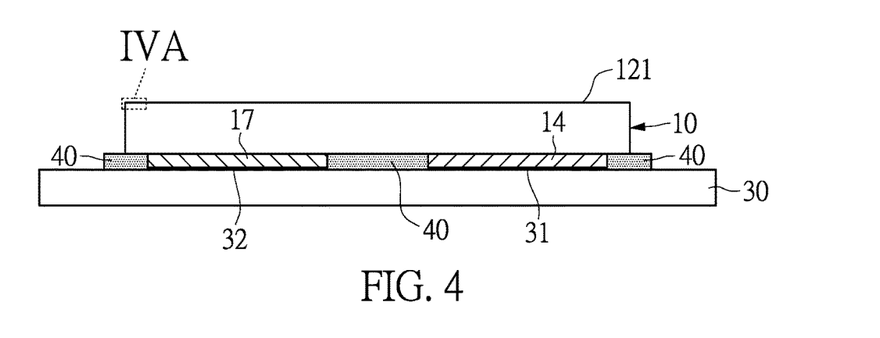
FIG. 4 is a schematic view of a thin film chip of the instant disclosure in which an epitaxial structure is roughened.
Figure 4A:
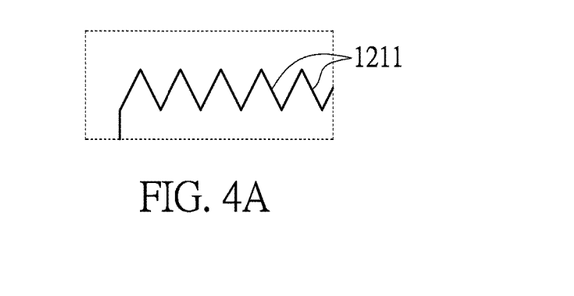
FIG. 4A is a partially enlarged view of part A in FIG. 4.

Reference is now made to FIG. 4 and FIG. 4A. The third step of the instant disclosure is roughening a semiconductor layer of the exposed epitaxial structure 10 after the growth substrate 20 is lifted-off. The semiconductor layer is the N-type semiconductor layer 12, which is an N-type gallium nitride layer in the present embodiment. The process for roughening the semiconductor layer includes the following steps: wet etching the semiconductor layer by alkali hydroxides until a plurality of pyramids 1211 generated on the upper surface 121 of the semiconductor occupy more than 20% of the surface area. When necessary, the wet etching process can further include an etching process assisted by UV light or heat for increasing the formation of the pyramids 1211.

For example, in the present embodiment, the wet etching process includes the following steps: immersing the flip chip 100 without the growth substrate 20 in a 3 M (molarity, mol/L) potassium hydroxide solution for more than 10 minutes for roughening the surface of the N-type semiconductor layer 12 by hydroxide ions. Removing the flip chip 100 and rinsing the same in water via ultrasonic for a predetermined time, for example, 10 minutes. The remaining gallium metal particles can be removed by potassium hydroxide (KOH) or acids such as hydrochloric acid (HCl) with higher concentrations.

Figure 5:
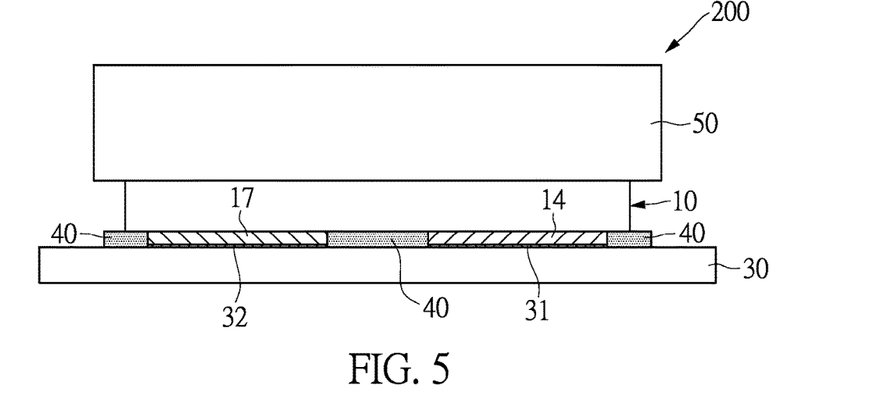
FIG. 5 is a schematic view of the thin film chip of the instant disclosure with a wavelength converting layer attached thereto.

Referring to FIG. 5, the fourth step of the instant disclosure is bonding a wavelength converting layer 50 which is light-transmittable on the epitaxial structure 10 of the thin film chip. In the embodiment shown in FIG. 1A, the wavelength converting layer 50 is disposed on the N-type semiconductor layer 12 located on the top surface of the epitaxial structure 10. Accordingly, a light-emitting diode chip structure 200 is formed. The wavelength converting layer 50 of the present embodiment is a light-transmittable layer such as a phosphor sheet. The wavelength converting layer 50 of the instant disclosure can be a phosphor sheet or a gel material including wavelength converting materials.

For example, the process of bonding the wavelength converting layer 50 includes attaching a phosphor sheet on the epitaxial structure 10, i.e. the phosphor sheet is attached on the N-type semiconductor layer 12 of the epitaxial structure 10 as shown in FIG. 1A. In an exemplary embodiment, the phosphor sheet is a sheet-like material formed by the mixture of phosphors with gels, ceramics or glass materials. The Shore hardness of the phosphor sheet after curing is larger than D40, and the thickness thereof can be controlled within a range of 60 to 350 micrometers (μm). The size of the phosphor sheet can be larger than or equal to that of the epitaxial structure 10 of the thin film chip. For example, the wavelength converting layer 50 is attached by a die bonder, and a force of about 120 g is applied to the thin film chip (for removing the growth substrate 20 from the flip chip 100) to ensure complete bonding of the wavelength converting material.

Figure 5A:
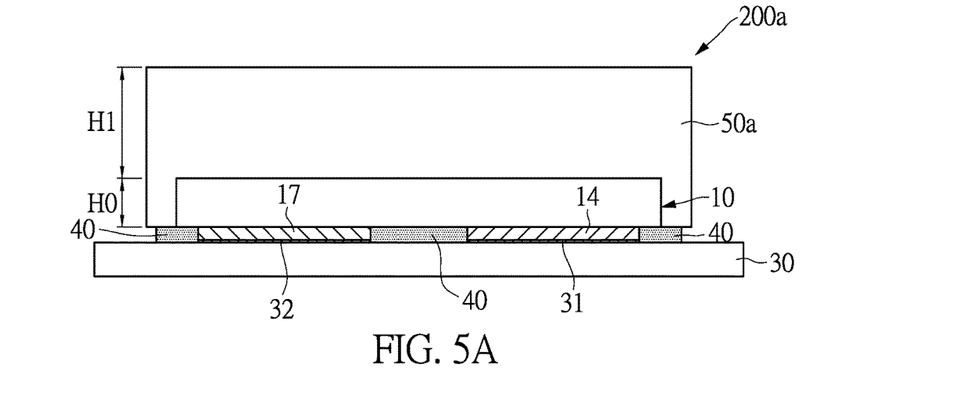
FIG. 5A is another embodiment of the thin film chip of the instant disclosure with a wavelength converting layer attached thereto.

For example, when the phosphor sheet includes a gel material, the process for attaching the wavelength converting layer can include directly covering the gel material onto the epitaxial structure 10. In an embodiment, the view angle adjusting structure completely covers an exposed top surface and the side surfaces of the epitaxial structure 10. In an embodiment, a gel material including a wavelength converting material covers all the exposed outer surfaces (including the upper surface 121 and the four side surfaces of the epitaxial structure 10) of the thin film chip (the flip chip without the growth substrate 20). As shown in FIG. 5A, the wavelength converting layer 50a extends to the two sides of the epitaxial structure 10 and completely covers the epitaxial structure 10 for forming a light-emitting diode chip structure 200a. In addition, since the gel material will directly contact the flip chip 100, the gel material is a heat and light resistant material such as silicone gel having a refractive index of 1.4.

Figure 5B:
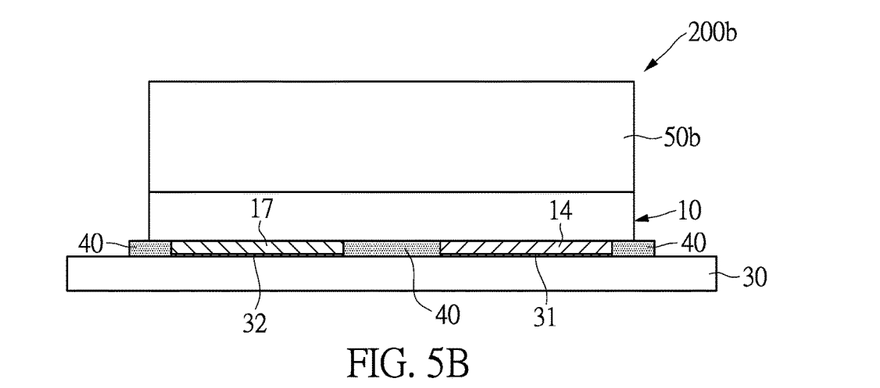
FIG. 5B is yet another embodiment of the thin film chip of the instant disclosure with a wavelength converting layer attached thereto.
Figure 5C:
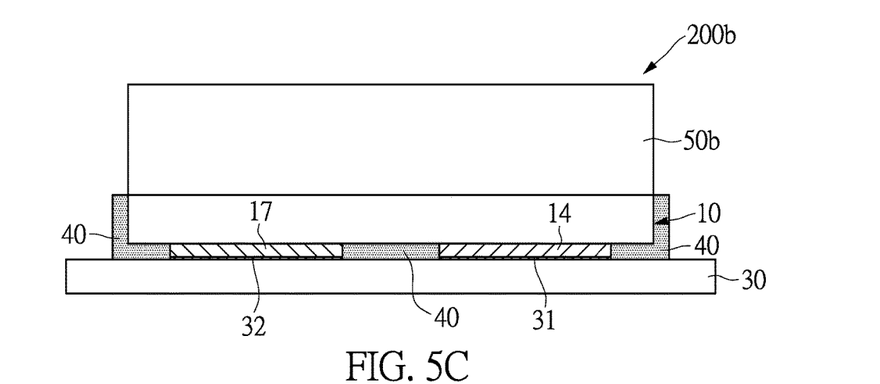
FIG. 5C is yet another embodiment of the thin film chip of the instant disclosure with a wavelength converting layer attached thereto.

Reference is now made to FIG. 5B. The difference between the embodiment shown in FIG. 5B and the previous embodiment is that in the present embodiment, the width of the wavelength converting layer 50b of the light-emitting diode chip structure 200b is substantially equal to the width of the epitaxial structure 10. Reference is next made to FIG. 5C. In this embodiment, the width of the wavelength converting layer 50b of the light-emitting diode chip structure 200b is substantially equal to the width of the epitaxial structure 10. In addition, the filling layer 40 further extends and covers the sides of the epitaxial structure 10. Preferably, the filling layer 40 of the present embodiment is made of an opaque underfill material for surrounding the light-emitting layer of the thin film chip. The opaque underfill material can reduce the overall view angle, thereby controlling the range of the view angle. The underfill material can be silicone gel or epoxy resin, and preferably a white underfill material for maintaining the brightness of the product. In the instant disclosure, the width of the wavelength converting layer can be larger than or equal to the width of the epitaxial structure 10.

Taking an Epistar 45 mil flip chip as an example, the view angle of a blue chip is about 130 degrees before the growth substrate 20 is removed. After removing the growth substrate 20, the overall thickness of the chip is reduced by about 140 μm, thereby reducing the refraction and scattering of light. Therefore, the epitaxial structure 10, i.e., the light-emitting layer, of the chip has a thickness ("H0" as shown in FIG. 5A) of about 8-10 μm and the view angle can be about 117 degrees. In addition, since the thickness of the thin film chip is less than 10 μm, light emitted by the blue chip is mostly emitted from the front side and almost all blue light can be converted into white light by the wavelength converting layer. Furthermore, after the growth substrate 20 is removed, the wavelength converting layers 50, 50a, 50b having wavelength converting materials can reinforce the strength of the overall structure and prevent blue light of the light-emitting layer from leaking by controlling the width of the wavelength converting layer.

A feature of the present embodiment is that the overall view angle of the light-emitting diode chip structure 200 can be adjusted by controlling the thickness of the wavelength converting layer 50. A light-emitting package structure 200 with a desired view angle can be manufactured based on a predetermined view angle. The wavelength converting layers mentioned above can be considered as a view angle adjusting structure.

The first experimental embodiment is carried out using a structure illustrated in FIG. 5A. The growth substrate of an EPISTAR 45 mil flip chip is laser lifted-off. H0 represents the thickness of the epitaxial structure 10 after the growth substrate is removed, which is about 10 μm. H1 represents the distance between the top surface of the wavelength converting material and the top surface of the epitaxial structure 10. H=H0+H1 and is the overall thickness of the wavelength converting layer. H is equal to the distance between the top surface of the wavelength converting layer 50a and the bottom surface of the epitaxial structure 10.

TABLE 1

| | | Z axis view angle | |
|---|---|---|---|
| chip type | H (μm) | 0 degree | 90 degrees |
| comparative example | 10 | 117.3 | 116.3 |
| example 1 | 60 | 120.4 | 120.0 |
| example 2 | 220 | 129.1 | 131.6 |
| example 3 | 350 | 133.7 | 136.4 |

Figure 6:
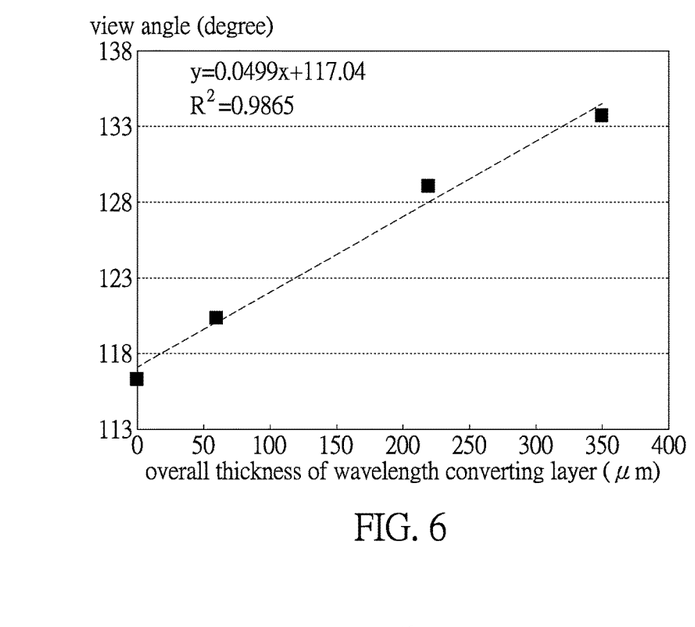
FIG. 6 is a coordinate diagram showing a data of a first experimental embodiment of the instant disclosure.
Figure 7:
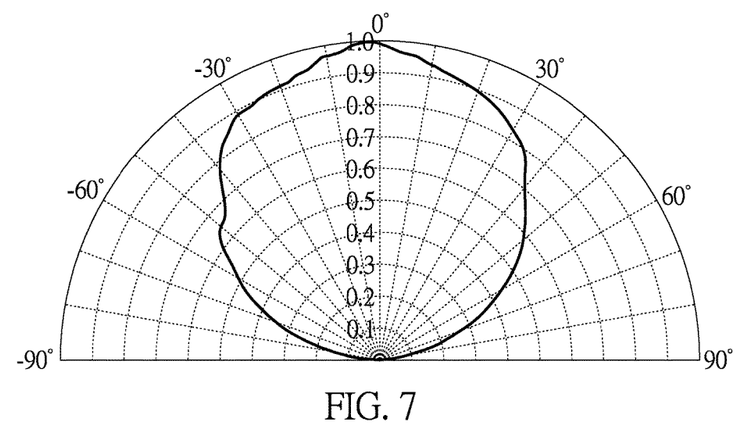
FIG. 7 is a light pattern under a view angle of 0 degrees of a light-emitting package structure without a wavelength converting layer attached thereto.

As shown in Table 1, when the overall thickness of the wavelength converting layer increases, the view angle increases. When the overall thickness of the wavelength converting layer decreases from 350 μm to 60 μm, the view angle decreases from 133.7 degrees to 120.4 degrees. The measurement of the view angles is carried out in a range of 50% of the maximum intensity in the light pattern diagram. The comparative example is measured based on a 0 degree view angle of a structure shown in FIG. 4 (without the wavelength converting layer), and the light pattern diagram is shown in FIG. 7. As shown in FIG. 6, the relationship between the view angle and the overall thickness of the wavelength converting layer are substantially in a linear function. Based on linear regression analysis, the linear regression equation between the independent variable X (the overall thickness of the wavelength converting layer) and the dependent variable Y (the view angle), which can be used to predict the view angle of the structure, can be obtained as follows:

view angle=(117+0.05×overall thickness of the wavelength converting layer in micrometer (H))°.     Equation 1:

Based on the linear regression equation above, the instant disclosure can include the step of attaching a wavelength converting layer having corresponding thickness on the epitaxial structure 10 according to the desired view angle of the light-emitting package structure. Unnecessary experiment and adjustments can thus be avoided.

Figure 8:
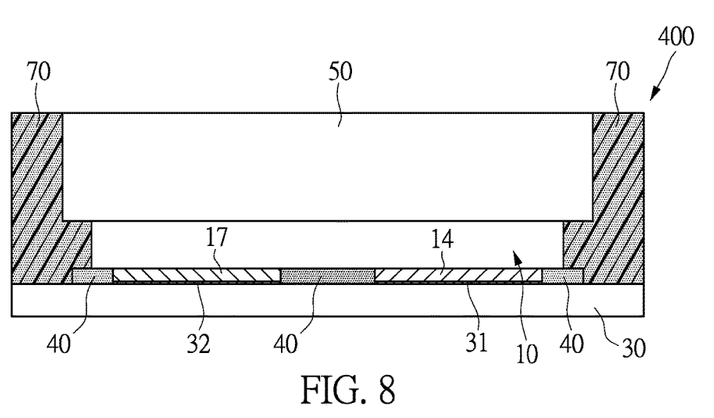
FIG. 8 is a schematic view of a light-emitting package structure of the instant disclosure having a reflecting wall.

Reference is now made to FIG. 8. The arrangement of a reflecting wall can also be referred to as a white wall forming process. Different from the wavelength converting layer 50 mentioned above, the light-emitting package structure 400 includes a wavelength converting layer 50 having a same size as the epitaxial structure 10 and a reflecting wall 70. The reflecting wall 70 surrounds the epitaxial structure 10 and the wavelength converting layer 50, and the top surface of the reflecting wall 70 and the top surface of the wavelength converting layer 50 are on the same plane or the top surface of the reflecting wall 70 is higher than the top surface of the wavelength converting layer 50 by 10~50 μm. The top surface of the wavelength converting layer 50 can be covered by the reflecting wall 70 or exposed from the reflecting wall 70. In an embodiment, a white resin is molded to surround the epitaxial structure 10 and the wavelength converting layer 50 for reducing the view angle. The advantage of using the white resin is that the white resin can serve as a reflector. In addition, since the light-emitting layer has a thickness of 10 μm, the reflector does not significantly affect the lateral light and the view angle can be reduced without reducing the brightness. The wavelength converting layer 50 and the reflecting wall 70 mentioned above are together considered as a view angle adjusting structure in the present embodiment.

An advantage of the present embodiment is that by selecting the reflectivity of the reflecting wall 70, the overall view angle of the light-emitting package structure 400 can be easily adjusted. In the following experiment, the reflectivity is changed from 0% to 100% by mixing reflective particles in different concentration into four reflecting wall materials for forming four types of reflecting walls. The testing samples are labeled as silicone resin No. 1-4.

Figure 8A:
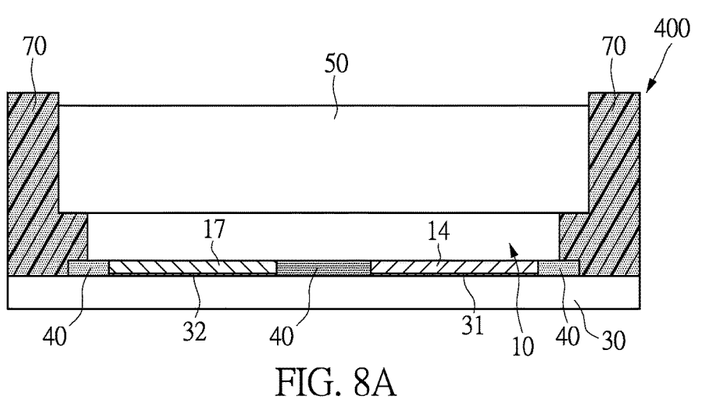
FIG. 8A is a schematic view of a light-emitting package structure of the instant disclosure having another reflecting wall.
Figure 8B:
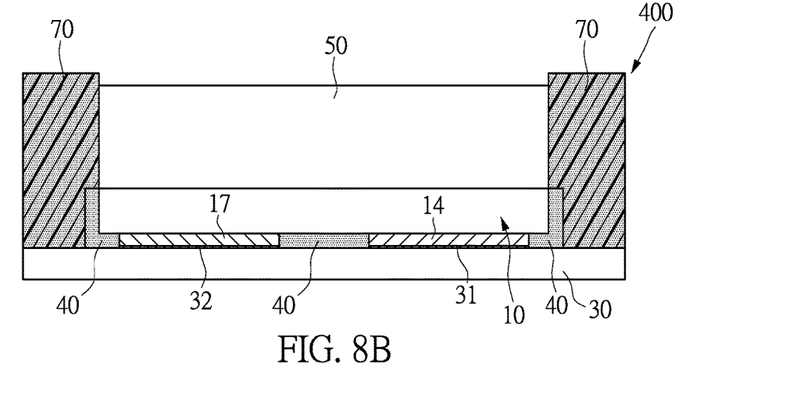
FIG. 8B is a schematic view of a light-emitting package structure shown in FIG. 5C with a reflecting wall.

In the second experimental embodiment of the instant disclosure, the top surface of the reflecting wall 70 and the top surface of the wavelength converting layer 50 are on the same plane (as shown in FIG. 8). In the third experimental embodiment of the instant disclosure, the top surface of the reflecting wall 70 is higher than the top surface of the wavelength converting layer 50 (as shown in FIG. 8A and FIG. 8B, in which FIG. 8A includes the structure shown in FIG. 5 and FIG. 8B includes the structure shown in FIG. 5C). The results show that when the top surface of the reflecting wall 70 is higher than the top surface of the wavelength converting layer 50 by 10~50 μm, the view angle can be reduced. Such a result becomes more significant as the reflectivity of the reflecting wall increases (to more than 70%).

Figure 9:
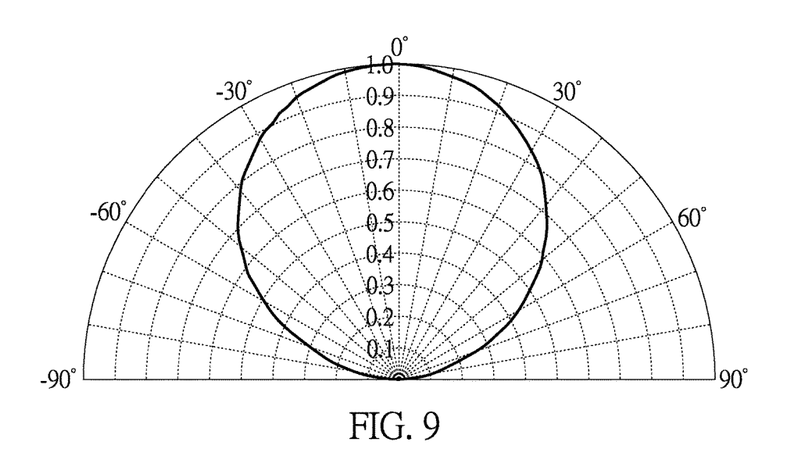
FIG. 9 is a light pattern of the light-emitting package structure shown in FIG. 8 with a reflecting wall having a reflectivity of 100%.

The structure shown in FIG. 8 which has a reflective wall having a reflectivity of 100% is used as a sample to carry out the experiment mentioned above. The results show that the view angle decreases from 142.0 degrees to 115.3 degrees. The light pattern of a view angle of 115.3 degrees is shown in FIG. 9. The results are summarized in the Table 2.

TABLE 2 z-axis view angle (0 degree)

| material of the reflective wall | color of the reflective wall | reflectivity | top surfaces of the reflecting wall and wavelength converting layer are co-planer | top surface of the reflecting wall is higher than the top surface of the wavelength converting layer |
|---|---|---|---|---|
| silicone resin 1 | transparent | 0.0% | 142.0 | NA |
| silicone resin 2 | grey-white | 74.7% | 120.5 | 120.3 |
| silicone resin 3 | off-white | 89.1% | 117.8 | 117.1 |
| silicone resin 4 | white | 100.0% | 115.3 | 114.0 |

The colors and the reflective indices towards a light having a wavelength of 449 nm of the reflecting wall materials are listed below:
  Silicone resin 1: transparent, reflectivity 0%;
  Silicone resin 2: gray-white, reflectivity 74.7%;
  Silicone resin 3: off-white, reflectivity 89.1%; and
  Silicone resin 4: white, reflectivity 100%.

Figure 10:
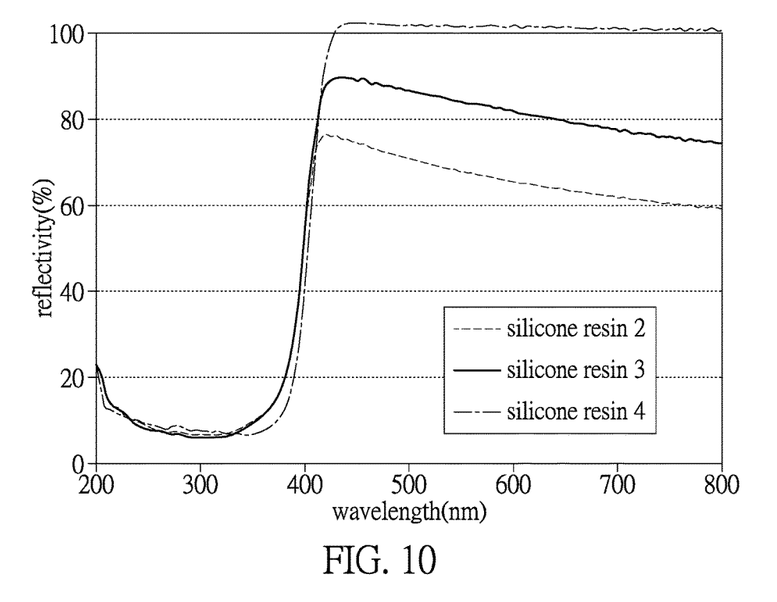
FIG. 10 depicts curve diagrams showing the relationship between the wavelength and the reflectivity of the reflecting wall under the use of different material.

Referring to FIG. 10, the silicone resins 2~4 are sheet-like materials each having a thickness of 0.5 mm, and the experiment is carried out under a wavelength of 449 nm. In practice, a wavelength larger than 425 nm can result significant difference in the reflectivity. The reflectivity of the silicone resins 3 and 4 start to reduce after a light having a wavelength larger than 450 nm is employed.

Figure 10A:
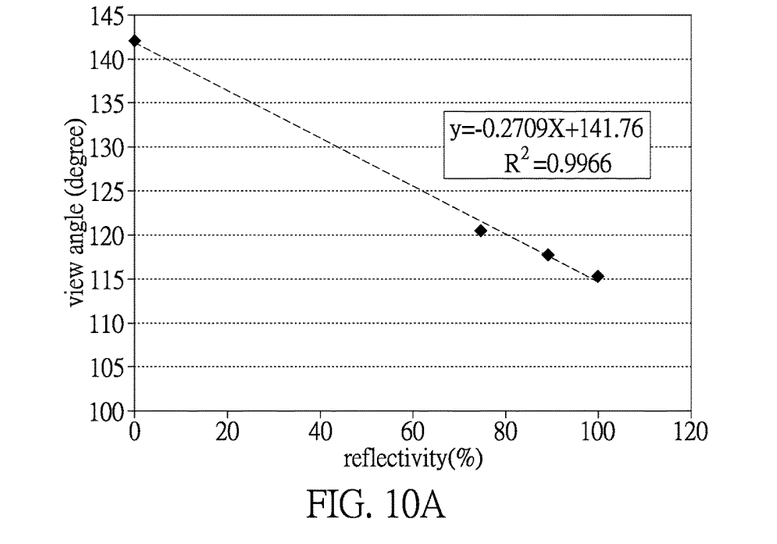
FIG. 10A is a coordinate diagram showing data of a second experimental embodiment of the instant disclosure.
Figure 10B:
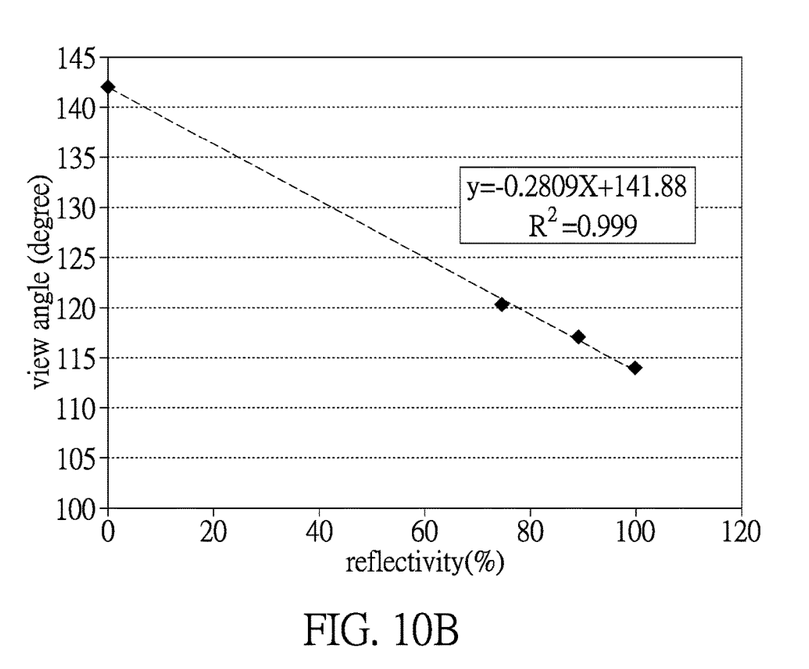
FIG. 10B is a coordinate diagram showing data of a third experimental embodiment of the instant disclosure.

Reference is now made to FIG. 10A. The linear relationship between the view angle and the reflectivity of the reflecting wall is established by the coordinate diagram of the second experimental embodiment. Based on linear regression analysis, the linear regression equation of the independent variable X (the reflectivity of the reflecting wall) and the dependent variable Y (view angle), which can be used to predict the view angle of the structure, can be obtained as follows:

view angle=(141.8−0.2709×reflectivity of the reflecting wall)°     Equation 2:

Referring to FIG. 10B, the top surface of the reflecting wall 70 is higher than the top surface of the wavelength converting layer 50 by 20 μm. The linear relationship between the view angle and the reflectivity of the reflecting wall is established by the coordinate diagram of the third experimental embodiment. Based on linear regression analysis, the independent variable X (the reflectivity of the reflecting wall) and the dependent variable Y (view angle), which can be used to predict the view angle, the following equation can be obtained:

view angle=(141.9−0.2809×reflectivity of the reflecting wall)°     Equation 3:

As shown in Table 2, when the reflectivity of the reflecting wall 70 is 100%, a smaller view angle in which the view angle is 1.2 to 1.3 degrees smaller than the original view angle can be achieved by setting the height differences between the top surfaces of the reflecting wall and the wavelength converting layer to be 20 μm. The higher the reflectivity of the reflecting wall 70 is, the more significant the reduction of the view angle becomes.

In addition, based on additional experimental results, a smaller view angle in which the view angle is about 2 degrees smaller than the original view angle can be achieved by setting the height differences between the top surfaces of the reflecting wall and the wavelength converting layer to be 50 μm. The height difference of 50 μm achieves a view angle difference that is 0.7 to 0.8 degrees higher than that achieved by a height difference of 20 μm.

In order to achieve a better view angle reducing effect, the reflecting wall 70 higher than the top surface of the 50 needs to be directly adjacent to the top surface of the wavelength converting layer 50.

In sum, the desired view angle of the light-emitting package structure products can be determined by the equations obtained through linear regression analysis, and such desired view angle can be achieved by selecting a reflecting wall having a corresponding reflectivity. The reflecting wall surrounds the epitaxial structure 10 and the wavelength converting layer 50. Therefore, unnecessary experiments can be avoided.

After the growth substrate of the flip chip is removed by a laser lift-off process, the flip chip 100 is referred to as the thin film chip, and includes the epitaxial structure 10, and the contact pads being the electrodes. Since light emitted from the sides reduces when the thickness of the thin film chip is reduced, the light pattern is more concentrated. For example, in an application of a projector, light emitted in ±10 degrees is required; in an application of face recognition, light emitted in ±40 degrees is required; and in an application of illumination, light emitted in ±60 degrees is required. Taking a blue chip as an example, after the growth substrate is removed, a luminous intensity (candlepower, I) within the range of ±10 degrees can be increased for 3%. The unit of the luminous intensity is candela (cd), which equal to lm/sr (lumen in a 3D angle [lm]/3D angle Ω [sr]).

Taking a packaged white light-emitting component as an example, the luminous intensity after removing the growth substrate increases as well. In addition, the structure in which the top surface of the reflecting wall is higher than the top surface of the wavelength can result in a more concentrated light pattern. The light pattern becomes more concentrated as the thickness of the thin film chip becomes smaller. A reflecting wall having a relatively high reflectivity can obtain a higher luminous intensity under a smaller view angle, i.e., a reflecting wall having a relatively high reflectivity can obtain a more concentrated light pattern. Different luminous intensities (%) of the first embodiment (as shown in Table 1) under different luminous angles are measured and summarized in Table 3.

TABLE 3

| | height of the reflecting wall | | |
| --- | --- | --- | --- |
| illumination angle | 60 μm | 220 μm | 350 μm |
| ±10° | 22% | 20% | 21% |
| ±40° | 68% | 63% | 65% |
| ±60° | 90% | 85% | 86% |
| ±90° | 100% | 100% | 100% |
| view angle | 120.4 | 129.1 | 133.7 |
| luminous intensity within the view angle | 90% | 89% | 92% |

In addition, based on the second and third experimental embodiments listed in Table 2, the luminous intensities (%) under different lamination angles are measured and summarized in Table 4.

TABLE 4

| | structure/height of the reflecting wall | | |
| --- | --- | --- | --- |
| illumination angle | before laser lift-off (comparative example) | after laser lift-off (second embodiment) | after laser lift-off + 20 μm (white wall exceeds the top surface of the wavelength converting layer) (third embodiment) |
| ±10° | 17% | 19% | 19% |
| ±40° | 63% | 67% | 67% |
| ±60° | 85% | 88% | 89% |
| ±90° | 100% | 100% | 100% |
| view angle | 127.7 | 121.6 | 120.3 |
| luminous intensity within the view angle | 88% | 89% | 89% |

The luminous intensities (%) under different view angles and reflecting walls having different reflective indices are measured based on the second and third embodiments, and the results thereof are listed in the following Table 5. As shown in FIG. 5, a reflecting wall having relatively high reflectivity has higher luminous intensity under a smaller angle. Therefore, a reflecting wall having relatively high reflectivity can lead to a more concentrated light pattern.

TABLE 5

| | luminous intensity | | | |
| --- | --- | --- | --- | --- |
| | reflectivity | | | |
| luminous angle | 0% | 75% | 89% | 100% |
| ±10° | 19% | 21% | 22% | 24% |
| ±40° | 60% | 65% | 67% | 72% |
| ±60° | 82% | 87% | 89% | 93% |
| ±90° | 100% | 100% | 100% | 100% |
| view angle | 142.0 | 120.5 | 117.8 | 115.3 |
| luminous intensity in the view angle | 92% | 87% | 87% | 91% |

In addition, light in ±40 degrees is more concentrated as a ratio obtained by taking the area obtained by integrating the luminous intensity in the view angle as the denominator and the area obtained by integrate the luminous intensity within ±40 degrees as the numerator becomes larger. Therefore, the light-emitting diode structure provided by the instant disclosure is practical.

In order to quantify the degree of concentration of light, the luminous intensity in ±10 degrees is defined as 23~27%, the luminous intensity in 10~40 degrees is defined as 50~53%. The ratio of the sum of the luminous intensity in the view angle of ±40 degrees and the luminous intensity area in the view angle of light emitted by the light-emitting package structure is larger than 0.7. In the range of 0~10 degrees, the ratio is 0.23~0.27, and in the range of 10~40 degrees, the ratio is 0.50~0.53.

Figure 11:
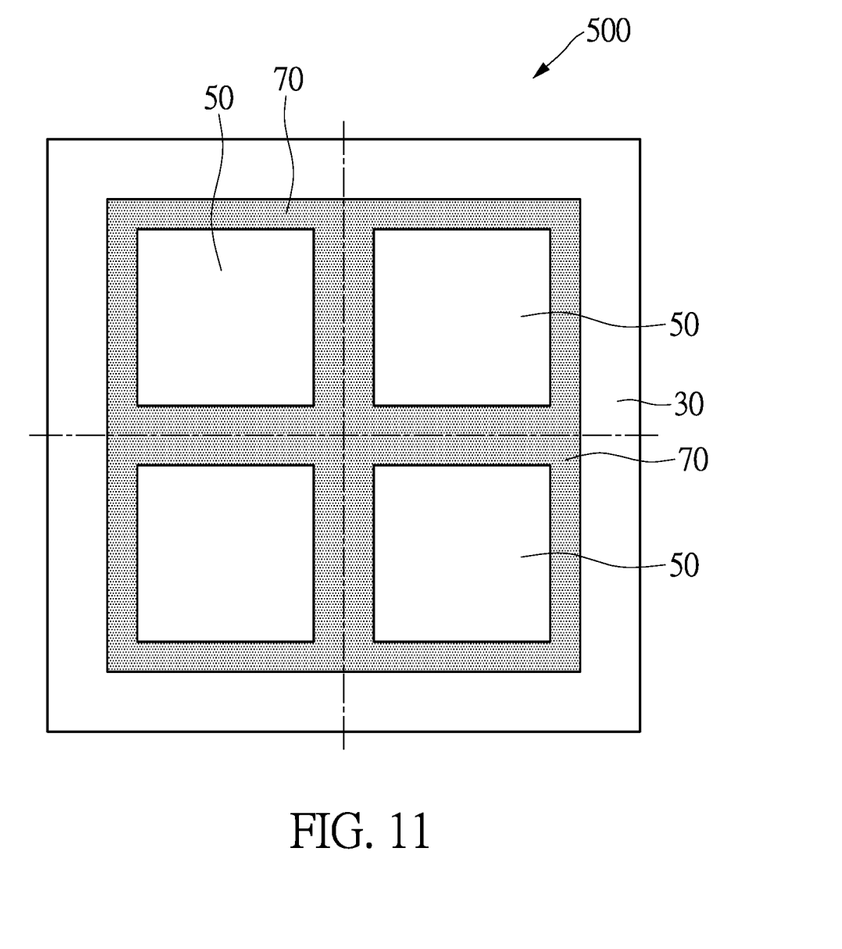
FIG. 11 is a top view of a light-emitting package module of the instant disclosure.

Reference is now made to FIG. 11. The instant disclosure further provides another method for forming a light-emitting package structure. Different from the previous embodiments, a plurality of flip chips are disposed on a carrier substrate 30 in an array such as a 2×2 array as shown in the figures. However, the number of the flip chips is not limited thereto. The electrodes (at least two electrodes) of each of the flip chips is connected to a corresponding circuit structure on the carrier substrate 30, and then the steps described in the previous embodiments, i.e., filling an underfill material, laser lifting-off, roughening the epitaxial structure are carried out. Afterwards, a wavelength converting layer 50 which is light-transmittable is disposed on the epitaxial structure of each of the thin film chips. Lastly, a reflecting wall 70 is formed to surround each of the wavelength converting layers 50 and each of the thin film chips, thereby forming a light-emitting package module 500.

When necessary, the light-emitting package module 500 can be cut along the dashed line shown in FIG. 11 for forming a plurality of light-emitting package structures 400 (as shown in FIG. 8, FIG. 8A and FIG. 8B).

The feature of the instant disclosure is that by controlling the thickness of the wavelength converting layer, the view angle of the light-emitting package structure can be adjusted according to a predetermined structure based on linear regression analysis. Therefore, a light-emitting package structure having a desired view angle can be obtained. In addition, by controlling the reflectivity of the reflecting wall, the overall view angle of the light-emitting package structure can be adjusted. In sum, the view angle and the thickness of the LED provided by the instant disclosure can be easily adjusted, thus enabling an optical design with increased flexibility.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A light-emitting package structure, comprising:
a carrier substrate having a circuit structure;
a thin film chip disposed on the carrier substrate and having an epitaxial structure and at least two electrodes disposed on a bottom surface of the epitaxial structure, the at least two electrodes contacting the circuit structure;
an underfill material disposed in a gap between the at least two electrodes of the thin film chip for supporting the thin film chip;
a wavelength converting layer at least covering the epitaxial structure of the thin film chip; and
a reflecting wall surrounding the wavelength converting layer and the thin film chip, wherein a reflectivity of the reflecting wall is larger than 70%, and a ratio between a total luminous intensity of light emitted by the light-emitting package structure in an illumination angle of ±40 degrees and a luminous intensity area within a view angle of light emitted by the light-emitting package structure is larger than 0.7.

2. The light-emitting package structure according to claim 1, wherein the underfill material is an opaque material.

3. The light-emitting package structure according to claim 1, wherein a top surface of the reflecting wall is higher than a top surface of the wavelength converting layer by 10 to 50 micrometers.

4. The light-emitting package structure according to claim 1, wherein when the illumination angle is within a range of 0~10 degrees, a ratio between the total luminous intensity of light emitted by the light-emitting package structure and the luminous intensity area within the view angle is within a range of 0.23 to 0.27.

5. The light-emitting package structure according to claim 1, wherein when the illumination angle is within a range of 10 to 40 degrees, the ratio between the total luminous intensity of light emitted by the light-emitting package structure and the luminous intensity area within the view angle is within a range of 0.50 to 0.53.

6. The light-emitting package structure according to claim 1, wherein the epitaxial structure has a roughness upper surface.

7. The light-emitting package structure according to claim 1, further comprising a plurality of pyramids formed on the upper surface of a semiconductor of the epitaxial structure.

8. The light-emitting package structure according to claim 7, wherein the plurality of pyramids formed on the upper surface of the semiconductor occupy more than 20% of the surface area.

9. The light-emitting package structure according to claim 1, wherein the Shore hardness of the wavelength converting layer is larger than D40, and the thickness of the wavelength converting layer is within a range of 60 to 350 micrometers.

10. The light-emitting package structure according to claim 1, wherein the size of the wavelength converting layer is larger than or equal to that of the epitaxial structure of the thin film chip.

11. The light-emitting package structure according to claim 1, wherein the wavelength converting layer further extends to two sides of the epitaxial structure.

12. A light-emitting package structure, comprising:
a carrier substrate having a circuit structure;
a thin film chip disposed on the carrier substrate and having an epitaxial structure and at least two electrodes disposed on a bottom surface of the epitaxial structure, the at least two electrodes contacting the circuit structure;
an underfill material disposed in a gap between the at least two electrodes of the thin film chip for supporting the thin film chip;
a view angle adjusting structure covering the epitaxial structure of the thin film chip; and
wherein a ratio between a total luminous intensity of light emitted by the light-emitting package structure in an illumination angle of ±40 degrees and a luminous intensity area within a view angle of light emitted by the light-emitting package structure is larger than 0.7.

13. The light-emitting package structure according to claim 12, wherein the view angle adjusting structure completely covers an exposed top surface and the side surfaces of the epitaxial structure.

14. The light-emitting package structure according to claim 12, wherein the wavelength converting layer is included in the view angle adjusting structure, attached to the epitaxial structure and extended to two sides of the epitaxial structure; wherein the overall thickness of the wavelength converting layer is a distance between a top surface of the wavelength converting layer to a bottom surface of the epitaxial structure; and wherein the view angle adjusting structure satisfies the following equation 1:

$$\text{view angle} = (117 + 0.05 \times \text{overall thickness of the wavelength converting layer in micrometer})°.$$

15. The light-emitting package structure according to claim 12, wherein the wavelength converting layer has a width larger than or equal to a width of the epitaxial layer.

16. The light-emitting package structure according to claim 12, wherein the view angle adjusting structure is a combination of a wavelength converting layer and a reflecting wall surrounding the wavelength converting layer.

17. The light-emitting package structure according to claim 16, wherein the wavelength converting layer and the reflecting wall is included in the view angle adjusting structure, the reflecting wall surrounding the epitaxial structure and the wavelength converting layer; wherein a top surface of the reflecting wall and a top surface of the wavelength converting layer are on a same plane; and wherein the view angle adjusting structure satisfies the following equation 2:

view angle=(141.8−0.2709×reflectivity of a reflecting wall)°.

18. The light-emitting package structure according to claim 16, wherein the wavelength converting layer and the reflecting wall are included in the view angle adjusting structure, the reflecting wall surrounding the epitaxial structure and the wavelength converting layer; and a top surface of the reflecting wall is higher than a top surface of the wavelength converting layer; and wherein the view angle adjusting structure satisfies the following equation 3:

view angle=(141.9−0.2809×reflectivity of the reflecting wall)°.

19. The light-emitting package structure according to claim 18, wherein the top surface of the reflecting wall exceeds the top surface of the wavelength converting layer for 10 to 50 micrometers.

\* \* \* \* \*